United States Patent
Zhang et al.

(10) Patent No.: US 9,522,525 B2
(45) Date of Patent: Dec. 20, 2016

(54) APPARATUS, PRINTERS, AND METHODS TO REMOVE MATERIAL FROM A PRINTER SURFACE

(75) Inventors: Daihua Zhang, Newark, CA (US); Napoleon J. Leoni, Palo Alto, CA (US); Henryk Birecki, Palo Alto, CA (US); Omer Gila, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/110,686

(22) PCT Filed: Apr. 29, 2011

(86) PCT No.: PCT/US2011/034680
§ 371 (c)(1),
(2), (4) Date: Oct. 8, 2013

(87) PCT Pub. No.: WO2012/148428
PCT Pub. Date: Nov. 1, 2012

(65) Prior Publication Data
US 2014/0150680 A1    Jun. 5, 2014

(51) Int. Cl.
*B41F 35/00* (2006.01)
*B41F 35/02* (2006.01)
*G03G 21/00* (2006.01)
*G03G 21/12* (2006.01)

(52) U.S. Cl.
CPC ........... *B41F 35/02* (2013.01); *G03G 21/0088* (2013.01); *G03G 21/12* (2013.01)

(58) Field of Classification Search
CPC .............................. B41F 35/02; G03G 21/0088
USPC ......................................................... 101/425
See application file for complete search history.

(56) References Cited

U.S. PATENT DOCUMENTS

| | | | | |
|---|---|---|---|---|
| 2,676,563 A | * | 4/1954 | Montgomery | D21H 5/0035 101/167 |
| 3,652,319 A | | 3/1972 | Amidon et al. | |
| 3,871,081 A | | 3/1975 | Inoue et al. | |
| 3,900,003 A | * | 8/1975 | Sato | G03G 15/0121 101/211 |
| 3,907,423 A | * | 9/1975 | Hayashi | G03G 15/11 118/262 |
| 3,996,888 A | | 12/1976 | Lofdahl et al. | |

(Continued)

FOREIGN PATENT DOCUMENTS

| | | |
|---|---|---|
| EP | 1679556 | 1/2006 |
| JP | H05-220941 | 8/1993 |

(Continued)

OTHER PUBLICATIONS

International Search Report and Written Opinion, issued in connection with International Application No. PCT/US2011/034680, on Jan. 18, 2012, 9 pages.

*Primary Examiner* — Anthony Nguyen
(74) *Attorney, Agent, or Firm* — Hanley Flight & Zimmerman, LLC

(57) ABSTRACT

Apparatus, printers, and methods to remove material from a printer surface are disclosed. An example apparatus includes a fluid remover to remove printing material from a printer surface, and a coating material reservoir to store coating material and to apply the coating material to the fluid remover to reduce an amount of printing material transferred to the fluid remover from the printer surface.

18 Claims, 2 Drawing Sheets

(56) References Cited

U.S. PATENT DOCUMENTS

| | | | |
|---|---|---|---|
| 4,009,657 A * | 3/1977 | Bonanno | B41F 9/1081 101/157 |
| 4,040,383 A | 8/1977 | Vandervort | |
| 4,765,242 A * | 8/1988 | Oya et al. | 101/425 |
| 4,974,027 A | 11/1990 | Landa et al. | |
| 5,335,596 A * | 8/1994 | DeMoore et al. | 118/261 |
| 5,476,043 A * | 12/1995 | Okuda | B41L 13/06 101/416.1 |
| 5,745,829 A | 4/1998 | Gazit et al. | |
| 6,108,513 A | 8/2000 | Landa et al. | |
| 6,292,642 B1 | 9/2001 | Chang et al. | |
| 6,308,034 B1 * | 10/2001 | Nakashima | G03G 15/105 399/249 |
| 6,312,103 B1 | 11/2001 | Haluzak | |
| 7,760,217 B1 * | 7/2010 | Fotland | B41J 2/0057 347/140 |
| 8,137,756 B2 * | 3/2012 | Hori | B41J 2/0057 101/167 |
| 2002/0098016 A1 * | 7/2002 | Kurotori | G03G 15/11 399/237 |
| 2003/0167948 A1 | 9/2003 | Weitz | |
| 2004/0187718 A1 * | 9/2004 | Ross et al. | 101/350.6 |
| 2004/0234309 A1 * | 11/2004 | Nagata et al. | 399/348 |
| 2006/0029430 A1 * | 2/2006 | Hosoya | G03G 15/11 399/249 |
| 2006/0210315 A1 * | 9/2006 | Nakamura et al. | 399/237 |
| 2008/0226322 A1 * | 9/2008 | Bernsdorf | G03G 13/20 399/67 |
| 2008/0274267 A1 * | 11/2008 | Hoedl et al. | 427/8 |
| 2010/0103437 A1 | 4/2010 | Li | |
| 2010/0215405 A1 * | 8/2010 | Patton | G03G 15/104 399/237 |

FOREIGN PATENT DOCUMENTS

| | | |
|---|---|---|
| JP | 09-234858 | 9/1997 |
| JP | 2004-122102 | 4/2004 |
| WO | WO-9631809 | 10/1996 |
| WO | WO-9961958 | 12/1999 |
| WO | WO-2010039134 | 4/2010 |

* cited by examiner

APPARATUS, PRINTERS, AND METHODS TO REMOVE MATERIAL FROM A PRINTER SURFACE

BACKGROUND

Some printers generate hard images using inks suspended in a carrier fluid. After applying the inks and carrier fluid to a transfer surface, some or all of the carrier fluid is removed from the transfer surface and/or recycled to facilitate drying of the ink, fixation of the image to the substrate, and/or formation of the hard image.

DETAILED DESCRIPTION

Figure 1:
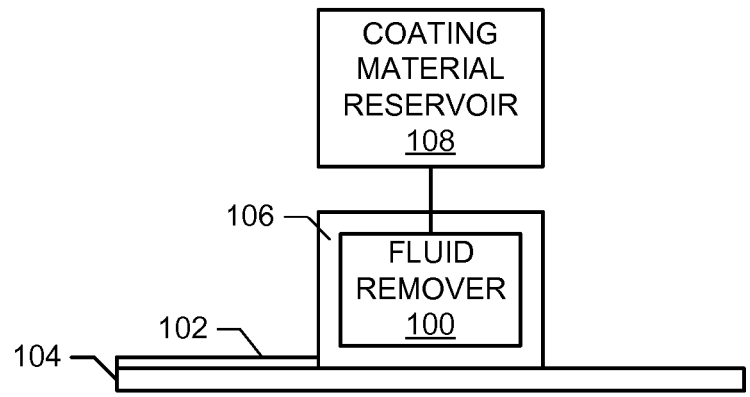
FIG. 1 illustrates an example fluid remover, constructed in accordance with the teachings herein.

Squeegee rollers are used in known printers to remove excess fluids (e.g., carrier fluid for a marking agent) from a surface. The squeegee roller applies pressure to the surface, thereby forcing excess fluid to flow off of the surface. The amount of fluid remaining on the surface of the squeegee depends on the pressure between the squeegee roller and the surface. Known squeegee rollers can cause damage to an image formed from marking agents arranged on a printer surface when the squeegee roller applies pressure. In particular, some marking agents, when applied to printer surfaces having a higher temperature (e.g., a intermediate transfer member, a blanket), develop adhesive properties and may be transferred from the printer surface to the squeegee roller. Such a transfer can disrupt the pattern of the marking agent that should be transferred to a substrate for fixation and creation of a hard image (e.g., a print).

A transfer of marking agents, printing material, and/or other fluid(s) from one surface to another is referred to herein as "back-transfer." An example of back-transfer is the transfer of marking agent forming a latent image from a blanket to a squeegee roller. Back-transfer can occur in known squeegee rollers because: 1) the blanket is made of a low-surface-energy material and the printing material on the blanket tends to transfer to a higher-surface-energy squeegee when the two surfaces meet at a nip; and/or 2) melted printing material on a relatively hot blanket may solidify when brought into contact with a cold squeegee roller as the phase transition reduces free enthalpy of the printing material.

Example apparatus, printers, and methods disclosed herein use a fluid remover including a remover surface to remove excessive printing material (e.g., carrier oil) from a printer surface, such as a transfer blanket to reduce or even prevent the back-transfer problem of the prior art. More specifically, some example apparatus, printers, and methods disclosed herein prepare a latent image on a blanket for subsequent transfer to a print substrate by removing carrier fluid with a fluid remover without disrupting the latent image on the blanket. In some examples, the fluid remover includes a remover surface, such as a squeegee roller, that forms a nip with a printer surface from which the printing fluid is to be removed. The remover surface is coated with a coating material to reduce, avoid, or even prevent back-transfer of the printing fluid from the printing surface to the remover surface.

In some examples, a coating blade is provided to receive coating material from a coating material reservoir and to apply the coating material to the remover surface. The coating blade applies a pressure to the remover surface to reduce a thickness of the coating material on the remover surface. By reducing the thickness of the coating material applied to the remover surface, an amount of printing fluid that may be removed from the printer surface is increased. Additionally, example apparatus, printers, and methods disclosed herein effectively remove printing material from a printing surface in a wide range of condition(s) on the printing surface, such as temperature, pressure, and/or electrical fields which may be affecting the printer surface and/or the printing material.

In some examples the coating material used to coat the remover surface is the same material as the printing material. Some example coating materials act as lubricants between the remover surface and the printer surface. Example apparatus, printers, and methods disclosed herein reduce or even prevent cross-contamination of printer materials and/or other materials that are on the printer surface.

As used herein, the term "printing material" refers to any solid or fluid material or combination of solid and/or fluid materials that may be used in a printing and/or image forming apparatus including, but not limited to, marking agents, pigments, toners, dyes, inks, carrier fluids, resins, oils, washing fluids, image coating materials, substrate coating materials, print substrate pre-treatment materials, and/or print substrate post-treatment materials. In some examples disclosed herein, the printing material includes a combination of marking agent, carrier fluid, and resin, where the carrier fluid is to be removed from a printer surface by a remover surface and a coating material on the remover surface is to reduce or even prevent adhesion of solid and/or fluid materials (e.g., the marking agent and/or the resin) to the remover surface.

FIG. 1 illustrates an example fluid remover 100 constructed in accordance with the teachings of this disclosure. The example fluid remover 100 of FIG. 1 may be used to remove printing material 102 from a printer surface 104. In particular, the fluid remover 100 of the illustrated example includes a coating material 106 to prevent the printing material 102 from adhering to the fluid remover 100. The example fluid remover 100 of FIG. 1 further includes a coating material reservoir 108 to store coating material 106 and to apply the coating material 106 to the fluid remover 100. The printing material 102 may have adhesive properties when applied to the printer surface 104. As a result, shear stresses caused by the fluid remover 100 could, in the absence of the example coating material 106, cause the printing material 102 or an underlying material (e.g., a marking agent, a resin) to be removed from the printing surface 104 or otherwise disrupted.

The coating material 106 of the illustrated example acts as a lubricant between the fluid remover 100 and the printing material 102. The coating material 106 reduces an amount of the printing material 102 that is transferred to the fluid remover 100 from the printer surface 104. In some examples, the coating material 106 prevents the printing material 102 from being transferred to the fluid remover 100 from the printer surface 104. The example coating material 106 is applied to the fluid remover 100 and formed into a relatively thin layer (e.g., about 9 nm thick although other thicknesses may also be used). The thickness of the example coating material 106 applied to the fluid remover 100 affects an amount of printing material 102 that is removed from the printer surface 104. For example, as the thickness of the coating material 106 decreases, the fluid remover 100 removes more printing material 102 from the printer surface 104. In examples where the printing material 102 is a carrier fluid (e.g., Isopar L) on a image transfer surface (e.g., a rubber blanket) for a marking agent (e.g., Hewlett-Packard Electro Ink® inks) to be applied to a substrate, reducing the amount of printing material 102 on the printer surface 104 advantageously reduces an amount of energy needed to prepare the marking agent for transfer and fixation onto the substrate.

Figure 2:
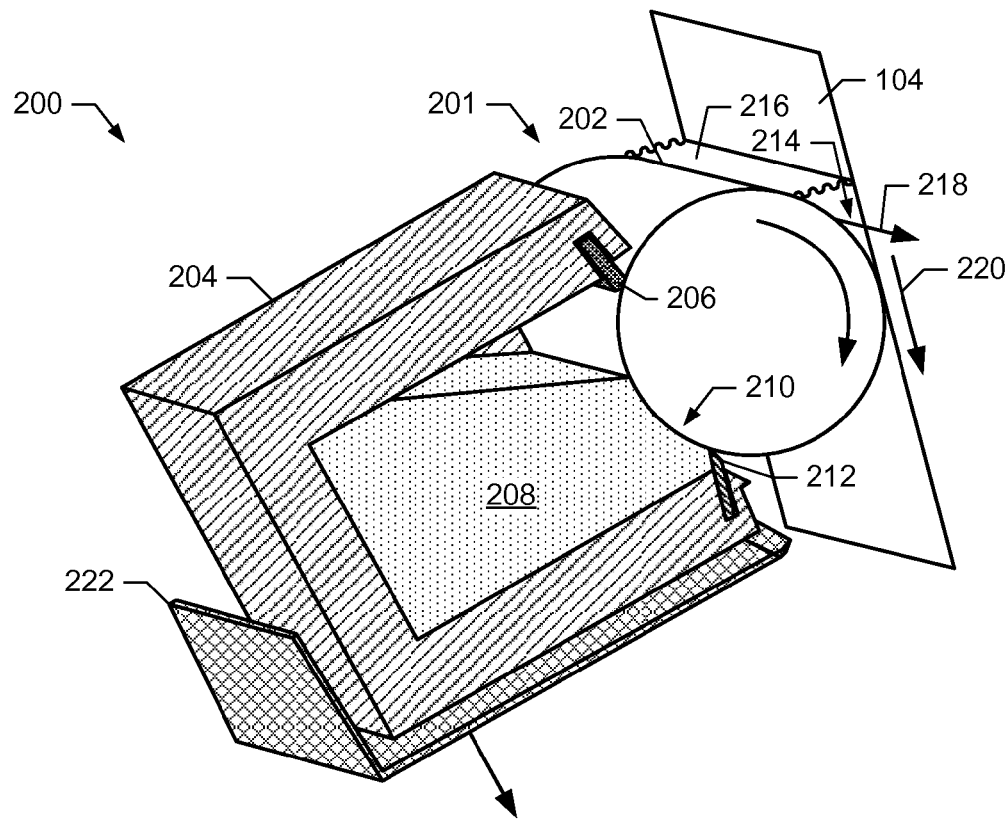
FIG. 2 is an isometric view of another example fluid remover, constructed in accordance with the teachings herein.

FIG. 2 is an isometric view of an example apparatus 200 including a fluid remover 201. The example fluid remover 201 of FIG. 2 includes a remover surface 202 and may be used to implement the example fluid remover 100 of FIG. 1 to remove printing material from a printer surface. The apparatus 200 of the illustrated example further includes a coating material reservoir 204, and a coating blade 206. The coating material reservoir 204 contains coating material 208, which is to be applied to the surface 202 of the remover 201.

In the example of FIG. 2, the fluid remover 201 is a squeegee roller that forms a nip 214 with a printer surface (e.g., the printer surface 104 of FIG. 1) to remove printing material from the printing surface 104. The example remover surface 202 is an external surface of the fluid remover 201. The printing surface 104 moves along the remover surface 202 as the remover surface 202 rotates. As shown in FIG. 2, the example remover surface 202 is in contact with the coating material 208 contained in the coating material reservoir 204.

As the remover surface 202 rotates, the remover surface 202 is coated with the coating material 208 in the coating material reservoir 204. The coating material 208 acts as a lubricant and substantially prevents back-transfer of printing material from the printer surface 104 to the remover surface 202. The example coating blade 206 of FIG. 2 is in contact with the remover surface 202 to set a thickness of the coating material 208 on the remover surface 202. To this end, the coating blade 206 applies a pressure to the remover surface 202, where the amount of applied pressure controls the thickness of the layer of coating material 208 on the remover surface 202. Excess coating material 208 is removed by the coating blade 206 and may return to the coating material reservoir 204. The thickness of the layer of coating material 208 left on the remover surface 202 by the coating blade 206 is based on a pressure between the coating blade 206 and the remover surface 202, the shape of the coating blade 206, the orientation of the coating blade 206 relative to the remover surface 202, and/or the hardness of the coating blade 206.

In operation, the remover surface 202 rotates. A section 210 of the remover surface 202 passes a seal 212 and contacts the coating material 208 contained in the reservoir 204. The seal 212 reduces or prevents leakage of the coating material 208 below the remover surface 202. A portion of the coating material 208 in the reservoir 204 coats the section 210 of the remover surface 202 in a layer of arbitrary thickness. As the coated remover surface 202 continues to rotate, the example coating blade 206 removes excess coating material 208 from the section 210 to leave a relatively thin layer (e.g., about 9 nm thick) that coats the remover surface 202.

The section 210 of the remover surface 202 coated with the thin layer of the coating material 208 rotates to a nip 214. At the nip 214, the printer surface 104 is coated with a marking agent (e.g., Hewlett-Packard Electro Ink® inks) arranged to form an image to be transferred to a substrate, and a carrier fluid or solvent (e.g., Isopar L) that is used when applying the marking agent to the printer surface 104.

The remover surface 202, coated with the layer of the coating material 208, causes excess carrier fluid 216 to be removed from the printer surface 104. For example, the excess carrier fluid 216 may flow in a direction 218 perpendicular to a direction of travel 220 of the printer surface 104. The example apparatus 200 further includes a collection tray 222 to collect the excess carrier fluid 216 removed from the printer surface 104. In the illustrated example, the excess carrier fluid 216 flows to the sides of the remover surface 202 and down to the collection tray 222. The collection tray 222 may further collect overflowing coating material 208 from the coating material reservoir 204. The excess carrier fluid and/or overflow coating material are directed to a collection tank (not shown) from the collection tray 222.

In the illustrated example, the coating material 208 employed is the same material as the printing material. As a result, the coating material 208 of the illustrated example does not contaminate the printing material (or any underlying material such as a marking agent) by coming into contact with the printing material. However, the coating material 208 may alternatively be different than the printing material.

Figure 3:
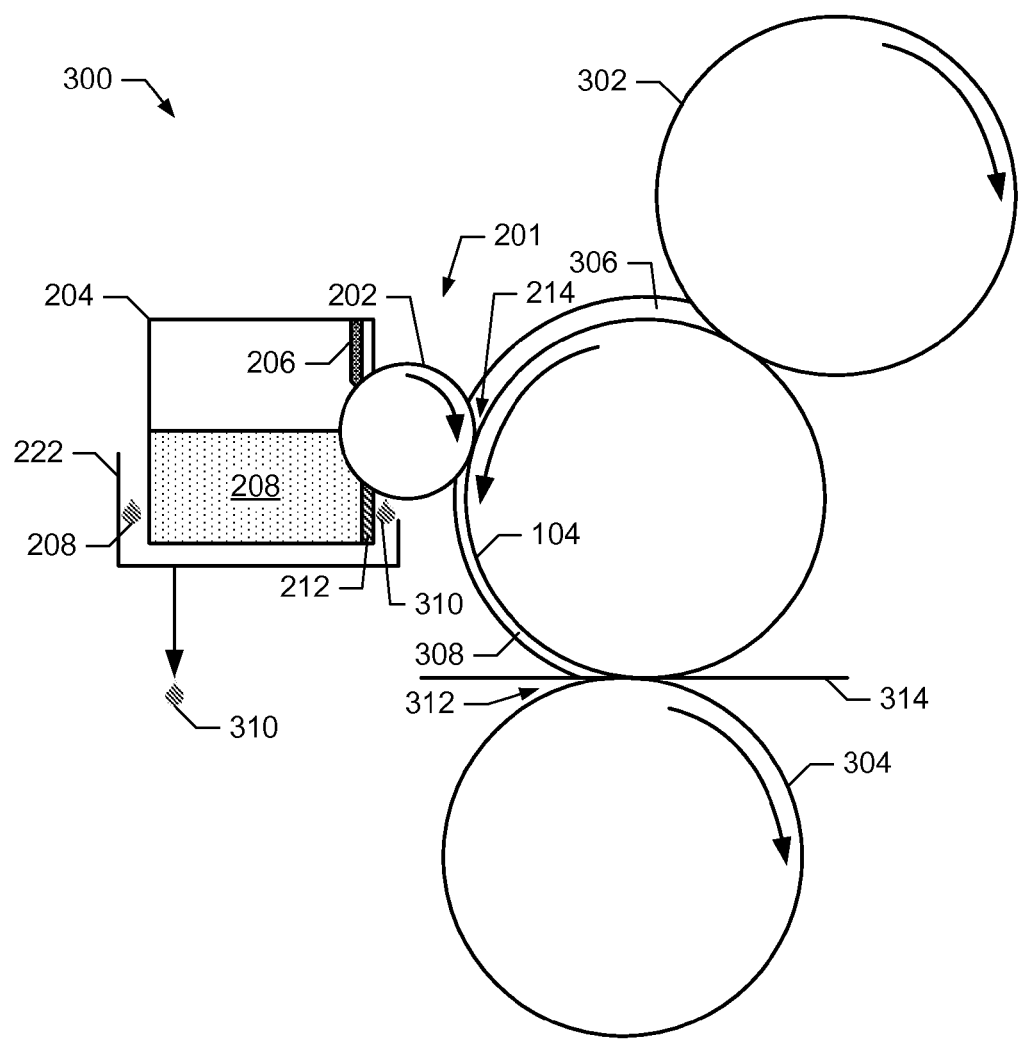
FIG. 3 illustrates an example printer including a printer surface and the example fluid remover of FIG. 2.

FIG. 3 illustrates an example printer 300 including a printer surface 104 and the example apparatus 200 of FIG. 2. As shown in FIG. 3, the example apparatus 200 includes the example fluid remover 201, the example coating material reservoir 204, the example coating blade 206, the example coating material 208, the example seal 212, and the example collection tray 222. The example fluid remover 201 is shown as a squeegee roller and includes the remover surface 202.

The example printer 300 further includes the example printer surface 104 of FIGS. 1 and 2. In the illustrated example, the printer surface 104 is a blanket, an intermediate transfer roller, or any other type of transfer surface. While the printer surface 104 is depicted in FIG. 3 as a roller or drum, this is only an illustrative example, and the example printer surface 104 may be any type of surface, such as flat, concave, and/or convex, and/or the surface 104 may be oriented in any desired manner. The example printer of FIG. 3 further includes a developer drum 302 and a transfer drum 304. The example developer drum 302 is a surface onto which marking agent and carrier fluid are initially deposited in a pattern to form a desired image. When deposited onto the developer drum 302, the carrier fluid carries the marking agent to the desired locations. However, this carrier fluid is not needed on the final fixed image, and is therefore removed prior to a transfer of the image to a substrate (e.g., at the printer surface 104). The developer drum 302 transfers the carrier fluid and marking agent to the printer surface 104 (e.g., a blanket) to form a first layer 306 having a first thickness, while maintaining the relative positioning of the marking agent to form the desired image.

The example printer surface 104 of FIG. 3 rotates from the location at which the transfer of the carrier fluid and marking agent occurs to a nip (e.g., the nip 214 of FIG. 2) between the remover surface 202 and the printer surface 104. At the nip 214, the example remover surface 202 removes a portion of the carrier fluid from the printer surface 104, leaving a second layer 308 having a second thickness less than the first thickness. The example remover surface 202 leaves the marking agent (and, thus, the image) substantially undamaged because the coating material 208 serves as a lubricant to substantially prevent transfer of the marking agent from the printer surface 104 to the remover surface 202. Excess carrier fluid 310 does not pass through the nip 214 but, instead, travels along the remover surface 202 to the collection tray 222. Because the coating material 208 of the illustrated example is the same as the carrier fluid 310, the excess carrier fluid 310 may be combined with overflow coating material 208 in the collection tray 222. In the example of FIG. 3, the carrier fluid 310 and/or the overflow coating material 208 are drained from the collection tray for disposal, reuse, and/or recycling.

The example printer surface 104 continues to rotate the marking agent and any remaining carrier fluid from the nip 214 toward the transfer drum 304. At a nip 312 between the transfer drum 304 and the printer surface 104, the example printer surface 104 (e.g., the blanket) transfers the marking agent and carrier fluid to a print substrate 314 in the nip 312 to form a hard image on the print substrate 314.

The example apparatus 200 may be installed in the printer 300. For example, the example coating material reservoir 204, the example coating blade 206, the example seal 212, the example collection tray 222, and the fluid remover 201, including the example remover surface 202, may be mounted or otherwise attached to the printer 300. In the example of FIGS. 2 and 3, the fluid remover 201 is attached to the printer 300 such that the remover surface 202 forms the nip 214 with the example printer surface 104. Additionally, the example remover surface 202 is coated with a layer of coating material 208. The thickness of the layer of coating material 208 is based on a pressure between the remover surface 202 and the coating blade 206, and based on the geometries of the blade 206. In some examples, the coating blade 206 may be adjusted to set or change the thickness of the layer of the coating material 208.

From the foregoing, it will be appreciated that above-disclosed apparatus, printers, and methods may be used to selectively remove at least some printing material from a printing surface without back-transfer of the printing material or an underlying material from the printing surface. As a result, in examples in which a carrier fluid is removed from an image to be transferred, example apparatus, printers, and methods remove at least a portion of the carrier fluid without damaging the image. Additionally, example apparatus, printers, and methods disclosed herein may be used to replace other drying methods for a printer surface (e.g., heaters). By replacing alternative drying methods that use more energy, example apparatus, printers, and methods disclosed herein may remove excess printing material at lower manufacturing and/or operating costs, and/or without contaminating the printer surface with undesired materials.

Example apparatus, printers, and/or methods disclosed herein may be used in many different applications to remove printing material from a printer surface by using different coating materials and/or adjusting a coating blade to set different thicknesses of the coating material on a fluid remover. Additionally, example apparatus, printers, and/or methods disclosed herein effectively remove printing material from a printing surface with relative indifference to conditions on the printing surface, such as temperature, pressure, and/or electrical fields of the printer surface and/or the printing material.

Although certain example apparatus, printers, and methods have been disclosed herein, the scope of coverage of this patent is not limited thereto. On the contrary, this patent covers all methods, printers, and apparatus fairly falling within the scope of the claims of this patent.

What is claimed is:

1. An apparatus to remove material from a printer surface, comprising:
   a fluid remover to remove printing material from a printer surface; and
   a coating material reservoir to store coating material and to apply the coating material to the fluid remover to reduce an amount of the printing material transferred to the fluid remover from the printer surface.

2. An apparatus as defined in claim 1, wherein the fluid remover comprises a remover surface to be coated with the coating material.

3. An apparatus as defined in claim 2, wherein the remover surface is to apply pressure to the printer surface to remove the printing material.

4. An apparatus as defined in claim 1, further comprising a coating blade to apply pressure to the fluid remover to set a thickness of the coating material on a surface of the fluid remover.

5. An apparatus as defined in claim 1, wherein the printing material and the coating material are a same material.

6. An apparatus as defined in claim 1, further comprising a collection tray to collect at least one of the printing material or the coating material.

7. An apparatus as defined in claim 1, wherein the fluid remover comprises a squeegee roller to apply pressure to the printer surface at a nip to remove the printing material from the printing surface.

8. A printer, comprising:
   a printer surface to receive a printing material; and
   a fluid remover to apply pressure to the printer surface, the fluid remover including a remover surface to be coated with a coating material, the fluid remover to remove a portion of the printing material from the printer surface, the printer surface to receive the printing material before the printer surface comes into contact with the fluid remover.

9. A printer as defined in claim 8, further comprising a coating material reservoir to apply the coating material to the fluid remover and a coating blade to set a thickness of the coating material on the fluid remover.

10. A printer as defined in claim 8, wherein the printer surface is to receive a marking material for application to a substrate, and the coating material is to reduce transfer of the marking material from the printer surface to the fluid remover.

11. A printer as defined in claim 10, wherein the fluid remover comprises a squeegee roller to apply pressure to the printer surface at a nip to remove a fluid material from the printer surface and not remove a solid material from the printer surface.

12. A printer as defined in claim 10, wherein the coating material is to reduce adhesion of at least one of a marking agent, a pigment, a toner, a dye, an ink, a carrier fluid, a resin, an oil, a washing fluid, an image coating material, a substrate coating material, a print substrate pre-treatment material, or print substrate post-treatment material to the remover surface.

13. A printer as defined in claim 8, wherein the coating material comprises a same material as the printing material.

14. A method to remove material from a printer surface, comprising:
   attaching a fluid remover to a printer, the fluid remover having a remover surface and a coating blade; and
   locating the remover surface to apply a first pressure to a printer surface and to be coated with a layer of a coating material, a thickness of the layer based on a second pressure between the remover surface and the coating blade, the fluid remover removing printing material previously applied to the printer surface.

15. A method as defined in claim 14, further comprising adjusting the coating blade to set the thickness of the layer.

16. An apparatus as defined in claim 1, wherein the printing material is separate from the coating material.

17. A printer as defined in claim 8, further comprising a developer drum to apply the printing material to the printer surface.

18. A method as defined in claim 14, wherein the printing material is applied to the printer surface spaced apart from the remover surface.

* * * * *